(12) United States Patent
Takahashi et al.

(10) Patent No.: US 9,065,456 B2
(45) Date of Patent: Jun. 23, 2015

(54) SEMICONDUCTOR DEVICE HAVING DLL CIRCUIT

(71) Applicant: MICRON TECHNOLOGY, INC., Boise, ID (US)

(72) Inventors: Hiroki Takahashi, Toyko (JP); Katsuhiro Kitagawa, Toyko (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/317,893

(22) Filed: Jun. 27, 2014

(65) Prior Publication Data

US 2015/0002196 A1    Jan. 1, 2015

(51) Int. Cl.
*H03L 7/06* (2006.01)
*H03L 7/197* (2006.01)

(52) U.S. Cl.
CPC .................................. *H03L 7/1972* (2013.01)

(58) Field of Classification Search
USPC ................................................ 327/149, 158
See application file for complete search history.

(56) References Cited

U.S. PATENT DOCUMENTS

| | | | | |
|---|---|---|---|---|
| 2010/0123495 A1* | 5/2010 | Kobayashi et al. | ........... | 327/158 |
| 2010/0201413 A1* | 8/2010 | Miyano | ........................ | 327/158 |
| 2011/0204942 A1* | 8/2011 | Abe et al. | ...................... | 327/158 |
| 2013/0043919 A1* | 2/2013 | Kitagawa | ...................... | 327/158 |
| 2013/0099838 A1* | 4/2013 | Kim et al. | ...................... | 327/158 |
| 2013/0121094 A1* | 5/2013 | Zerbe et al. | .................... | 365/194 |
| 2013/0207701 A1* | 8/2013 | Kitagawa | ...................... | 327/158 |
| 2013/0229214 A1* | 9/2013 | Ichida | ............................ | 327/158 |
| 2014/0084977 A1* | 3/2014 | Vlasenko et al. | ............. | 327/158 |
| 2014/0167826 A1* | 6/2014 | Kitagawa | ...................... | 327/158 |

* cited by examiner

*Primary Examiner* — Adam Houston
(74) *Attorney, Agent, or Firm* — Dorsey & Whitney LLP

(57) ABSTRACT

Disclosed herein is a device includes a first delay circuit delaying a first clock signal according to a count value to generate a second clock signal, a phase determination circuit comparing a phase of the first clock signal with a phase of the second clock signal to generate a phase determination signal, an up-down counter updating the count value according to the phase determination signal each time an update signal is activated, and an update control circuit generating the update signal at a variable interval.

20 Claims, 11 Drawing Sheets

SEMICONDUCTOR DEVICE HAVING DLL CIRCUIT

BACKGROUND

1. Field of the Invention

Embodiments of the present invention relate to a semiconductor device, and more particularly relate to a semiconductor device including a DLL (Delay Locked Loop) circuit that generates a phase-controlled internal clock signal.

2. Description of Related Art

A phase-controlled internal clock signal is needed sometimes in a semiconductor device that operates in synchronization with a clock signal, such as a synchronous DRAM (Dynamic Random Access Memory). The phase-controlled internal clock signal is often generated by a DLL circuit (see Japanese Patent Application Laid-open No. 2010-124020).

A state in which a phase-control led internal clock signal that is correctly controlled is output from the DLL circuit is referred to as "lock state". A maximum period from when the DLL circuit is reset to when the DLL circuit reaches the lock state (a maximum lock cycle) is defined by the specifications.

However, the maximum lock cycle is defined based on the number of cycles of a clock signal. Therefore, in a case of using a high-frequency clock signal, it is sometimes difficult to bring the DLL circuit into the lock state within the maximum lock cycle.

SUMMARY

In one embodiment, there is provided a semiconductor device that includes: a first delay circuit delaying a first clock signal according to a count value to generate a second clock signal; a phase determination circuit comparing a phase of the first clock signal with a phase of the second clock signal to generate a phase determination signal; an up-down counter updating the count value according to the phase determination signal each time sin update signal is activated; and an update control circuit generating the update signal at a variable interval.

In another embodiment, there is provided a semiconductor device that includes: a delay circuit that delaying a first clock signal according to a count value to generate a second clock signal; a phase determination circuit comparing a phase of the first clock signal with a phase of the second clock signal to generate a phase determination signal; an up-down counter updating the count value according to the phase determination signal each time an update signal is activated; and an update control circuit generating the update signal at a first interval, and then generating the update signal at a second interval that is different from the first interval.

According to the present invention, the generation interval of an update signal is variable, and therefore it is possible to shift a DLL circuit to a lock state quickly.

DETAILED DESCRIPTION OF THE EMBODIMENTS

Preferred embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
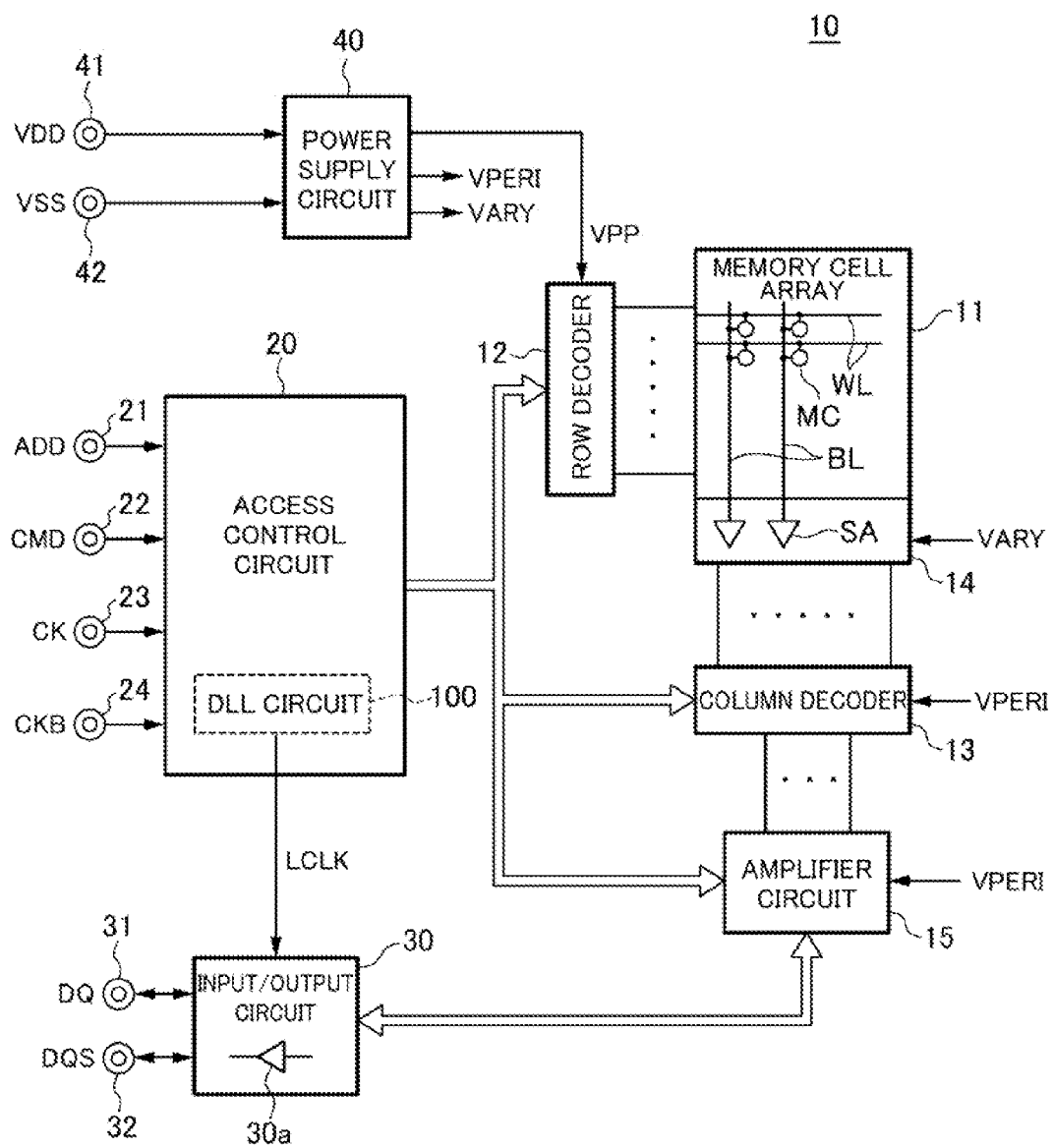
FIG. 1 is a block diagram indicative of an embodiment of a general configuration of a semiconductor device according to a preferred embodiment of the present invention.

Referring now to FIG. 1, the semiconductor device 10 according to the embodiment of the present invention is a DRAM and includes the memory cell array 11. In the memory cell array 11, a plurality of word lines WL and a plurality of bit lines BL intersecting with each other are provided and a plurality of memory cells MC are arranged at intersections thereof, respectively. Selection of a word line WL is performed by a row decoder 12 and selection of a bit line BL is performed by a column decoder 13. The bit lines BL are connected to corresponding sense amplifiers SA in a sense circuit 14, respectively, and a bit line BL selected by the column decoder 13 is connected to the amplifier circuit 15 through the corresponding sense amplifier SA.

Operations of the row decoder 12, the column decoder 13, the sense circuit 14, and the amplifier circuit 15 are controlled by an access control circuit 20. An address signal ADD, a command signal CMD, external clock signals CK and CKB, a clock enable signal CKB, and the like are supplied to the access control circuit 20 through external terminals 21 to 24. The external clock signals CK and CKB are signals complementary to each other. The access control circuit 20 controls the row decoder 12, the column decoder 13, the sense circuit 14, the amplifier circuit 15, and a data input/output circuit 30 based on these signals.

Specifically, when the command signal CMD indicates the active command, the address signal ADD is supplied to the row decoder 12. In response thereto, the row decoder 12 selects a word line WL indicated by the address signal ADD and accordingly corresponding memory cells MC are connected to the corresponding bit lines BL, respectively. The access control circuit 20 then activates the sense circuit 14 in a predetermined timing.

On the other hand, when the command signal CMD indicates the read command or the write command, the address signal ADD is supplied to the column decoder 13. In response thereto, the column decoder 13 connects a bit line BL indicated by the address signal ADD to the amplifier circuit 15. Accordingly, at the time of a read operation, read data DQ that are read from the memory cell array 11 through the corresponding sense amplifier SA are output to outside from the data terminal 31 through the amplifier circuit 15 and the data input/output circuit 30. At the time of a write operation, write data DQ that are supplied from outside through the data terminal 31 and the data input/output circuit 30 are written into the corresponding memory cells MC through the amplifier circuit 15 and the sense amplifier SA.

The access control circuit 20 includes a DLL circuit 100. The DLL circuit 100 generates an internal clock signal LCLK that is phase-controlled based on the external clock signals CK and CKB. The internal clock signal LCLK is supplied to an output circuit 30a included in the data input/output circuit 30. The read data DQ and a data strobe signal DQS are respectively output from the data terminal 31 and a data strobe terminal 32 in synchronism with the internal clock signal LCLK.

Each of the foregoing circuit blocks uses a predetermined internal voltage as its operating power supply. Such internal power supplies are generated by a power supply circuit 40. The power supply circuit 40 receives an external potential VDD and a ground potential VSS that are supplied through power supply terminals 41 and 42, respectively. Based on the potentials, the power supply circuit 40 generates internal voltages VPP, VPERI, VARY, etc. The internal potential VPP is generated by boosting the external potential VDD. The internal potentials VPERI and VARY are generated by stepping down the external potential VDD.

The internal voltage VPP is mainly used in the row decoder 12. The row decoder 12 drives a word line WL selected based on the address signal ADD to the VPP level, thereby making the cell transistors included in the memory cells MC conductive. The internal voltage VARY is mainly used in the sense circuit 14. The sense circuit 14, when activated, drives either one of each pair of bit lines to the VARY level and the other to the VSS level, thereby amplifying read data that is read out. The internal voltage VPERI is used as the operating voltage of most of the peripheral circuits such as the access control circuit 20. Using the internal voltage VPERI lower than the external voltage VDD as the operating voltage of the peripheral circuits reduces power consumption of the semiconductor device 10.

Figure 2:
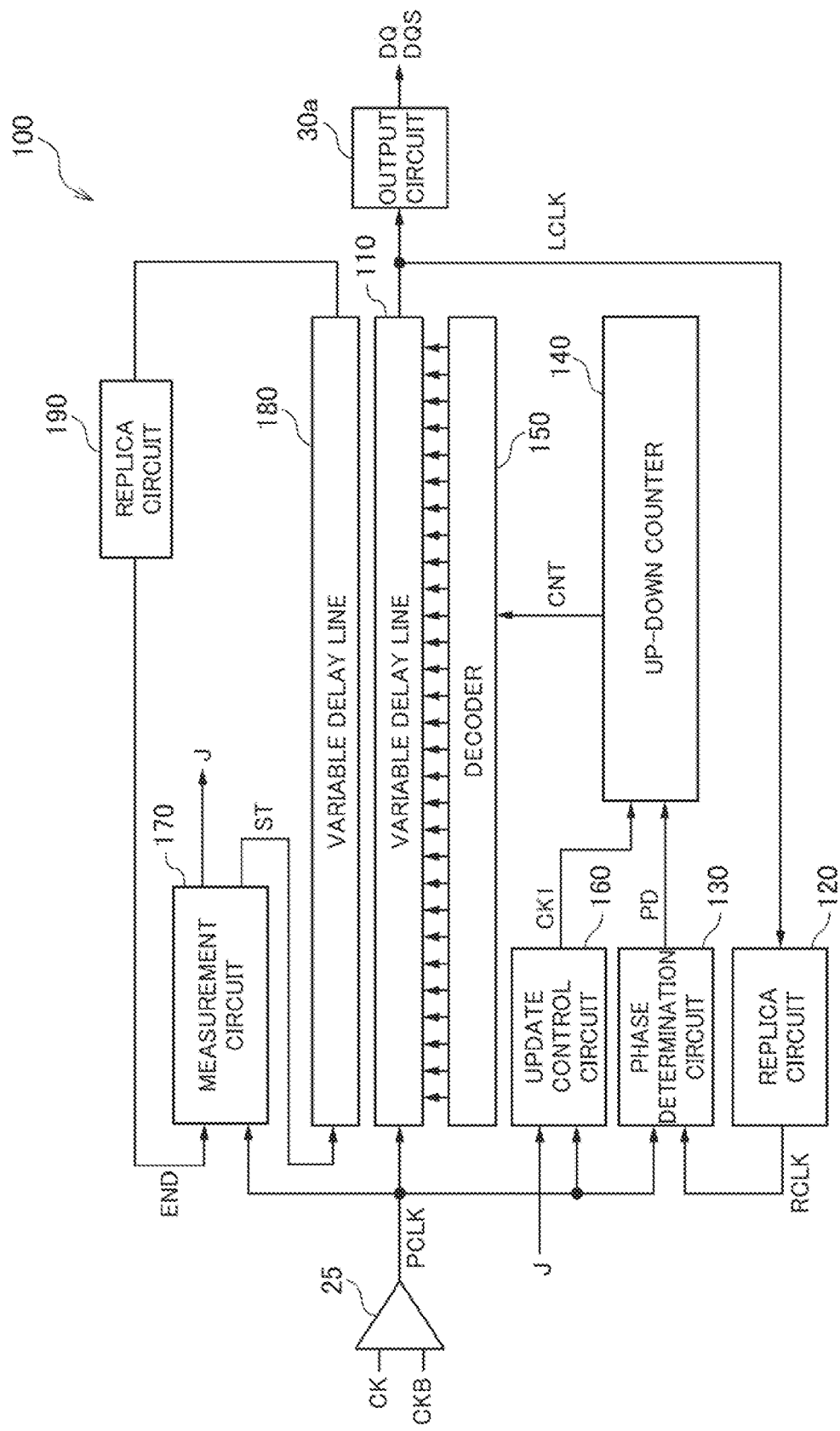
FIG. 2 is a block diagram indicative of an embodiment of a configuration of the DLL circuit according to a first embodiment of the present invention.

Turning to FIG. 2, the DLL circuit 100 includes a variable delay line 110 that generates an internal clock signal LCLK by delaying an internal clock signal PCLK. The internal clock signal PCLK is a first clock signal output from a clock receiver 25 that receives the external clock signals CK and CKB. The internal clock signal LCLK (third clock signal) output from the variable delay line 110 is supplied to an output circuit 30a, and as described above, used as a timing signal for defining an output timing of the read data DQ or the data strobe signal DQS.

The internal clock signal LCLK is supplied to a replica circuit 120. The replica circuit 120 is a circuit having substantially the same characteristic (impedance) as that of the output circuit 30a, and receives the internal clock signal LCLK to output a replica clock signal RCLK that is a second clock signal. Because the output circuit 30a outputs the read data DQ and the data strobe signal DQS in synchronization with the internal clock signal LCLK, the replica clock signal RCLK output from the replica circuit 120 is accurately synchronized with the read data DQ and the data strobe signal DQS. In the DRAM, the read data DQ and the data strobe signal DQS needs to be accurately synchronized with the external clock signals CK and CKB, and when there is a phase shift between the read data DQ and the external clock signals CK and CKB, the phase shift needs to be detected and corrected. The detection of the phase shift is performed by the phase determination circuit 130, and a result of the determination is output as a phase determination signal PD.

The phase determination signal PD is supplied to an up-down counter 140. The up-down counter 140 is a counter circuit that is counted up or counted down based on the phase determination signal PD. A count value CNT of the up-down counter 140 is supplied to a decoder 150. The decoder 150 decodes the count value CNT, and based on a decoded signal, a delay amount of the variable delay line 110 is controlled.

Counting up or counting down is performed by the up-down counter 140 in synchronization with an update signal CK1 generated by an update control circuit 160. The update control circuit 160 is a circuit that generates the update signal CK1 by dividing the frequency of the internal clock signal PCLK. As described later, its frequency division ratio is switched based on a count value J. That is, the update control circuit 160 can generate the update signal CK1 at a variable interval.

The reasons for using a variable generation interval of the update signal CK1 are explained below.

Figure 3:
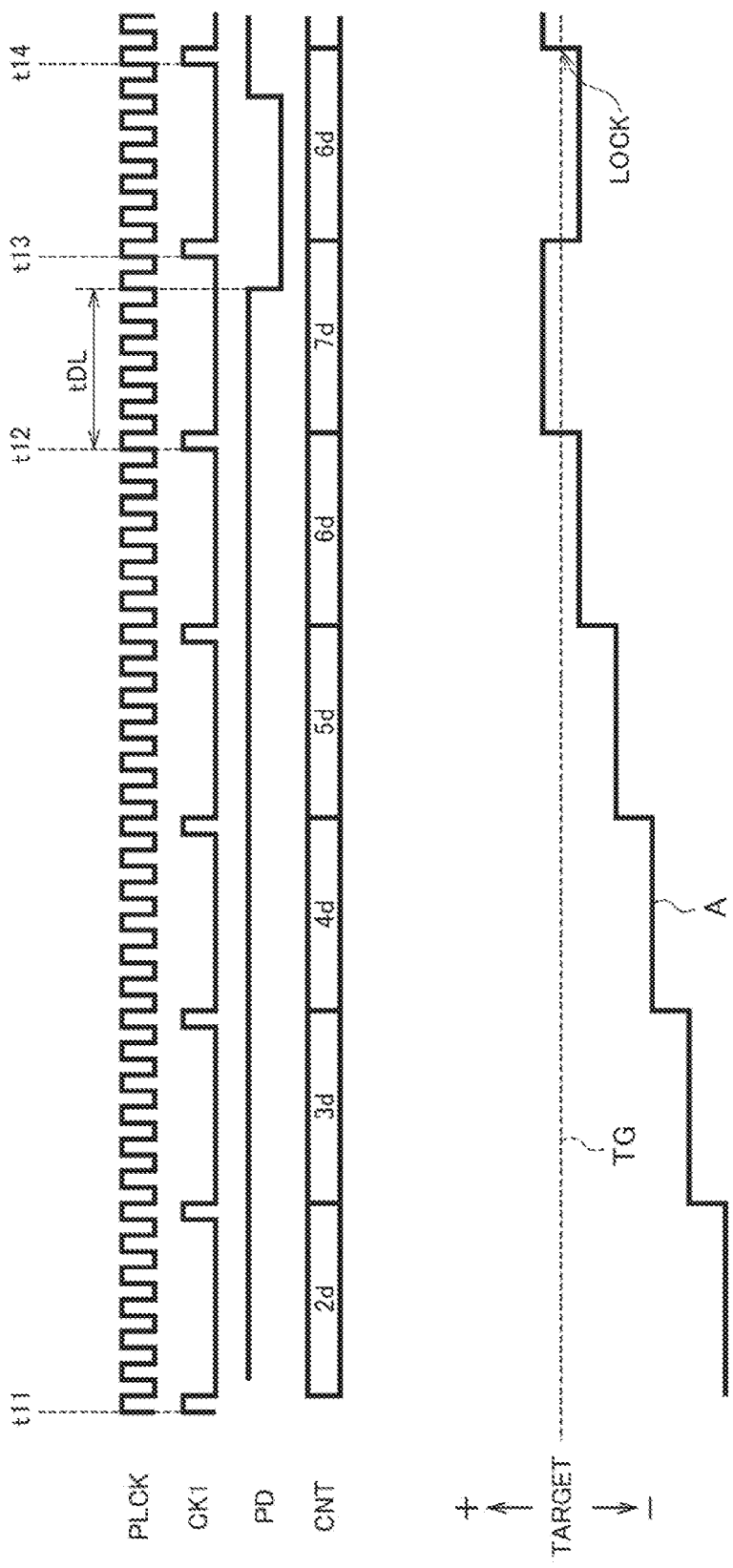
FIG. 3 is a timing diagram for explaining an operation of the DLL circuit shown in FIG. 2 in a case of using a constant generation interval of the update signal.

Turning to FIG. 3, the frequency division ratio of the update control circuit 160 is fixed at "6". Therefore, the update signal CK1 is activated every six cycles of the internal clock signal PCLK. A symbol TG represents a target phase of the replica clock signal RCLK. When a phase A of the replica clock signal RCLK is located on the negative side of the target TG, this indicates that the phase A of the replica clock signal RCLK is advanced relative to the internal clock signal PCLK. When the phase A of the replica clock signal RCLK is located on the positive side of the target TG, this indicates that the phase A of the replica clock signal RCLK is delayed relative to the internal clock signal PCLK.

When the phase A of the replica clock signal RCLK is advanced, the phase determination signal PD is at a high level, and the count value of the up-down counter 140 is counted up in synchronization with the update signal CK1. Because this increases the delay amount of the variable delay line 110, the phase A of the replica clock signal RCLK is controlled in the delay direction. On the other hand, when the phase A of the replica clock signal RCLK is delayed, the phase determination signal PD is at a low level, and the count value of the up-down counter 140 is counted down in synchronization with the update signal CK1. Because this decreases the delay amount of the variable delay line 110, the phase A of the replica clock signal RCLK is controlled in the advanced direction.

First, at a time t11 at which the DLL circuit 100 is reset, the phase A of the replica clock signal RCLK is advanced, and therefore each time the update signal CK1 is activated, the count value of the up-down counter 140 is counted up and changed from 2 d to 3 d, 4 d, and so on. Accordingly, the phase A of the replica clock signal RCLK gradually approaches the target TG.

The phase A of the replica clock signal RCLK then passes over the target TG by control that is in synchronization with a time t12, and is changed to the positive side of the target TG. However, the result of this phase change affects the phase determination signal PD via the variable delay line 110 and the replica circuit 120. Therefore, in the example shown in FIG. 3, after a lapse of a delay time tDL from the time t12, the phase determination signal PD is inverted from a high level to a low level.

Accordingly, at a time t13 at which the update signal CK1 is activated next, the count value of the up-down counter 140 is counted down. Consequently, the phase A of the replica clock signal RCLK passes over the target TG from the positive side to the negative side. At a time t14 at which the update signal CK1 is activated next, the count value of the up-down counter 140 is counted up, and the phase A of the replica clock signal RCLK passes over the target TG from the negative side to the positive side.

Although not particularly limited thereto, in the first embodiment, when the phase A of the replica clock signal RCLK passes over the target TG three times, the DLL circuit 100 is determined to be in the lock state. That is, when the up-down counter 140 performs an operation in the order of counting up, counting down, and counting up, or performs an operation in the order of counting down, counting up, and counting down, the DLL circuit 100 is determined to be in the lock state.

In the example shown in FIG. 3, because the generation interval of the update signal CK1 is appropriate, the DLL circuit 100 is shifted to the lock state relatively early. However, when the generation interval of the update signal CK1 is constant, it may take a long time to shift the DLL circuit 100 to the lock state depending on the frequency of the clock signal CK or the length of the delay time tDL. For example, when the generation interval of the update signal CK1 is too long relative to the delay time tDL, the time required to shift the DLL circuit 100 to the lock state increases accordingly. On the other hand, when the generation interval of the update signal CK1 is too short, an overshoot phenomenon occurs, which is explained below, and therefore the time required to shift the DLL circuit 100 to the lock state increases. When the overshoot phenomenon occurs, a problem also arises in that control jitter (dither jitter) of the internal clock signal LCLK is increased.

Figure 4:
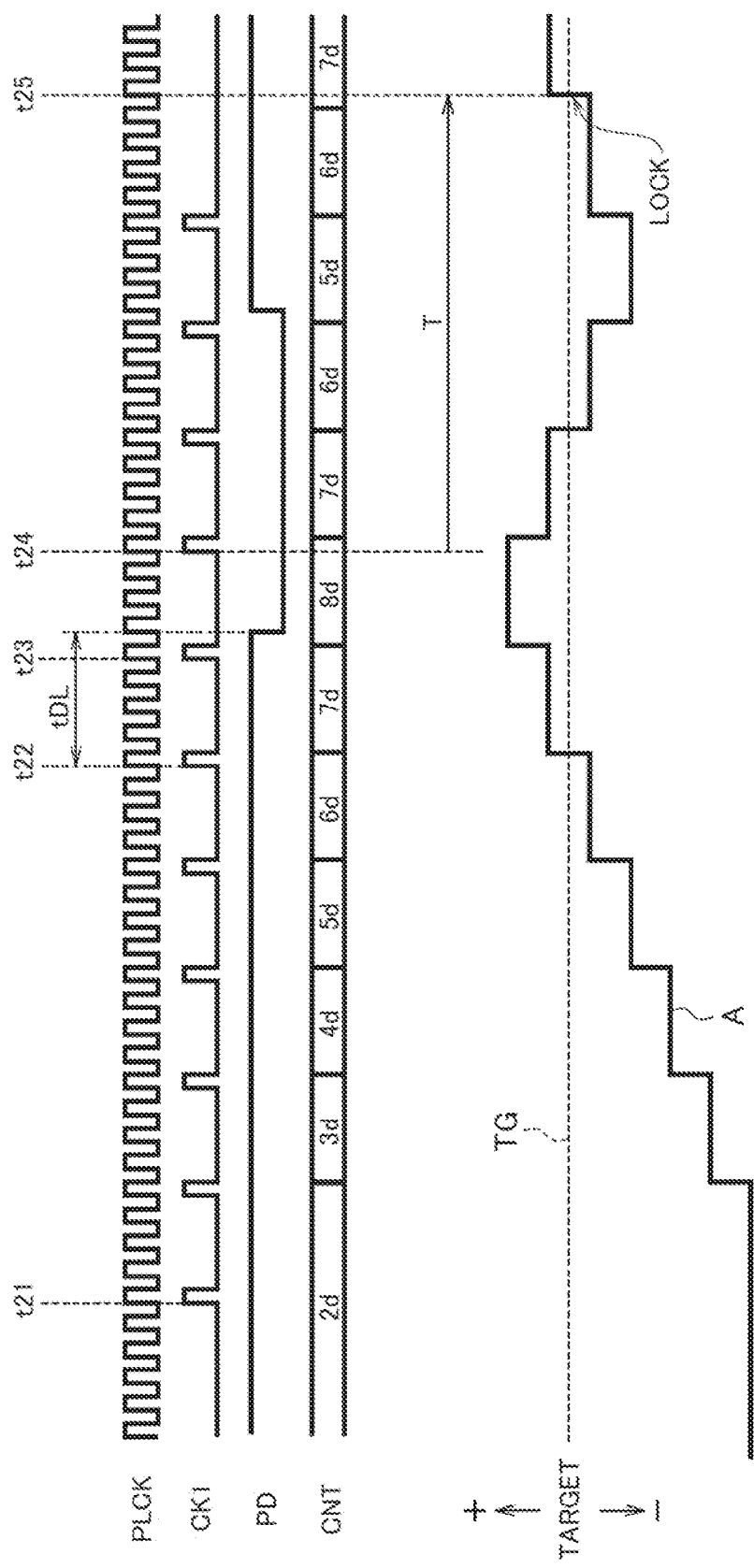
FIG. 4 is a timing diagram indicative of an embodiment of the state in which the overshoot phenomenon occurs because the generation interval of the update signal is short.

Turning to FIG. 4, the frequency division ratio of the update control circuit 160 is fixed at "4". Therefore, the update signal CK1 is activated every four cycles of the internal clock signal PCLK. First, at a time t21 at which the DLL circuit 100 is reset, the phase A of the replica clock signal RCLK is advanced, and therefore each time the update signal CK1 is activated, the count value of the up-down counter 140 is counted up and changed from 2 d to 3 d, 4 d, and so on. Accordingly, the phase A of the replica clock signal RCLK gradually approaches the target TG.

The phase A of the replica clock signal RCLK then passes over the target TG at a time t22, and is changed to the positive side of the target TG. However, the phase determination signal PD is affected by and changed with this phase change after a lapse of the delay time tDL from the time t22. This is later than a time t23 at which the update signal CK1 is activated next in the example shown in FIG. 4. Therefore, at the time t23 at which the update signal CK1 is activated next, the phase determination signal PD remains at a high level, and accordingly the count value of the up-down counter 140 is further counted up. This results in an overshoot of the phase A of the replica clock signal RCLK on the positive side of the target TG.

Such an overshoot occurs also on the negative side of the target TG, and the DLL circuit 100 is eventually shifted to the lock state at a time t25. Assuming that the generation interval of the update signal CK1 is appropriate, the DLL circuit 100 is supposed to be shifted to the lock state at a time t24. Therefore, when the overshoot phenomenon occurs, the lock cycle becomes longer by a period T.

As described above, the overshoot phenomenon occurs when the generation interval of the update signal CK1 is too short. Specifically, when a specific delay of the variable delay line 110 and the replica circuit 120 that constitute a delay circuit is represented as tDO, and a control delay due to sequence control is represented as tDC, the delay time tDL shown in FIGS. 3 and 4 is defined as tDL=tDO+tDC. The specific delay tDO is a delay that is not dependent on the frequency of a clock signal, but is decided by the circuit configuration of the delay circuit (the variable delay line 110 and the replica circuit 120), a threshold voltage of a transistor, a power-supply voltage, and a temperature, and the like. On the other hand, the control delay tDC is a delay that is dependent on the frequency of a clock signal.

Therefore, an optimum value Nopt of a frequency division ratio N used by the update control circuit 160 is expressed as Nopt=(tDO/tCK)+tDC+tLM, where the frequency of the clock signal CK is represented as tCK, and the loop margin is represented as tLM. It is desirable that the actual value of the frequency division ratio N is as small as possible within the range that satisfies an expression of N≥Nopt. When the frequency division ratio N is as N<Nopt, the overshoot phenomenon occurs.

Therefore, in the first embodiment, actual measurement of tDO/tCK is performed, and the control delay tDC and the loop margin tLM, which are already known, are added to the obtained value of tDO/tCK to calculate the optimum value Nopt, and decide the actual value of the frequency division ratio N based on the optimum value Nopt.

Referring back to FIG. 2, the DLL circuit 100 according to the first embodiment further includes a measurement circuit 170, a variable delay line 180, and a replica circuit 190, and uses these circuits to perform actual measurement of tDO/tCK. A result of the actual measurement is supplied to the update control circuit 160 as the count value J.

Figure 5:
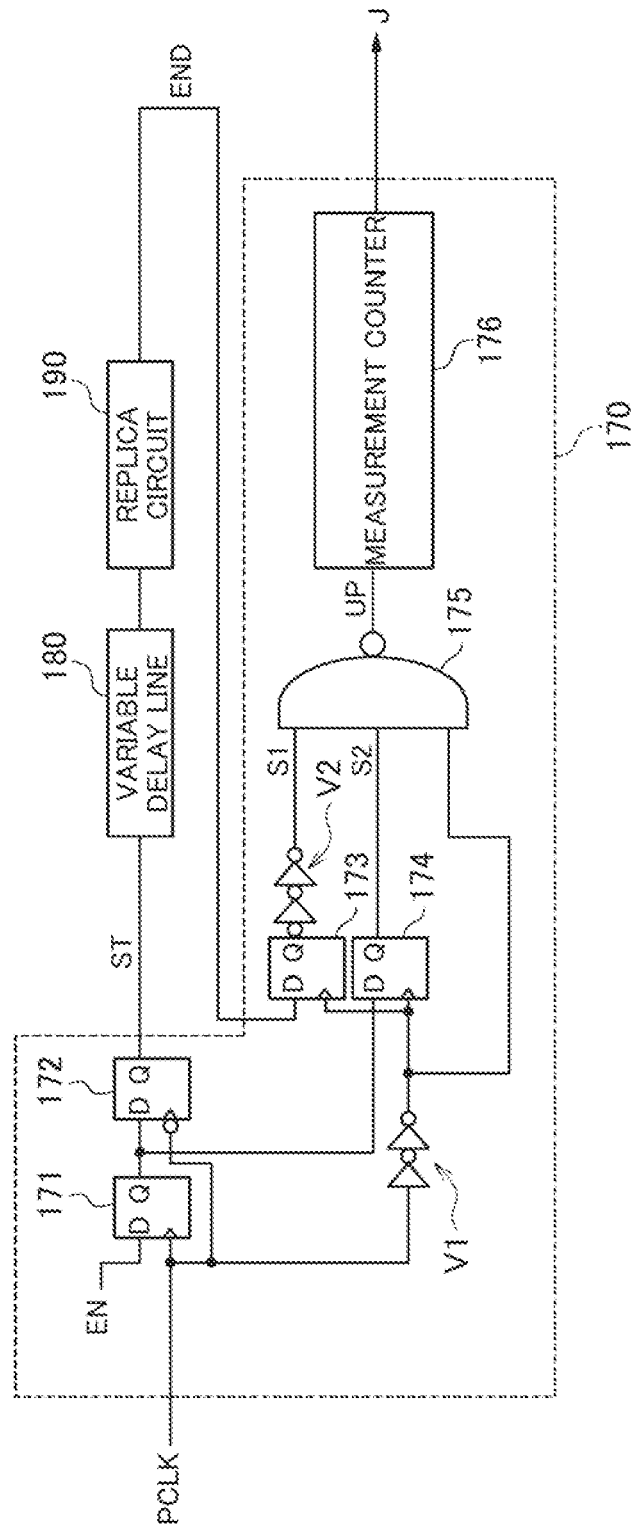
FIG. 5 is a circuit diagram indicative of an embodiment of the measurement circuit shown in FIG. 2.

Turning to FIG. 5, the measurement circuit 170 includes latch circuits 171 to 174, a 3-input NAND gate circuit 175, and a measurement counter 176. Each of the latch circuits 171 to 174 includes a data input node (D), a data output node (Q), and a clock node. Each of the latch circuits 171 to 174 latches the logic level of the data input node (D) in synchronization with a rising or falling edge of a signal input to the clock node, and outputs the latched logic level from the data output node (Q).

The latch circuits 171 and 172 are connected in cascade. The internal clock signal PCLK and its inverted signal are respectively input to their clock nodes. Further, an enable signal EN is input to the data input node (D) of the latch circuit 171. With this configuration, when the enable signal EN is changed to a high level, the high level signal is latched by the latch circuit 171 in synchronization with a rising edge of the internal clock signal PCLK, and the high level signal is latched by the latch circuit 172 in synchronization with the subsequent falling edge of the internal clock signal PCLK. A measurement start signal ST is output from the data output node (Q) of the latch circuit 172.

The measurement start signal ST is fed back to the measurement circuit 170 as a measurement end signal END via the variable delay line 180 and the replica circuit 190. The variable delay line 180 is a circuit that has the same delay amount as the variable delay line 110. The replica circuit 190 is a circuit that has the same delay amount as the replica circuit 120. Therefore, a period from when the measurement start signal ST is activated to when the measurement end signal END is activated substantially corresponds with a period from when a predetermined edge of the internal clock signal PCLK is input to the variable delay line 110 to when an edge of the replica clock signal RCLK, which corresponds to the predetermined edge, is fed back to the phase determination circuit 130.

The measurement end signal END is supplied to the data input node (D) of the latch circuit 173. Meanwhile, the data input node (B) of the latch circuit 174 is connected to the data output node (Q) of the latch circuit 171. The internal clock signal PCLK is supplied through a timing-adjusting two-stage inverter V1 to each clock node of the latch circuits 173 and 174.

Internal signals S1 and S2 and the internal clock signal PCLK are supplied to the NAND gate circuit 175, and a count-up signal UP output from the NAND gate circuit 175 is supplied to the measurement counter 176. The internal signal S1 is a signal obtained by inverting an output signal of the latch circuit 173 by an inverter V2. With this configuration, when both the internal signals S1 and S2 are activated to a high level, the count-up signal UP is activated in synchronization with the internal clock signal PCLK, and the measurement counter 176 increments the count value J each time the count-up signal UP is activated. The count value J represents tDO/tCK, and is supplied to the update control circuit 160 shown in FIG. 2.

Figure 6:
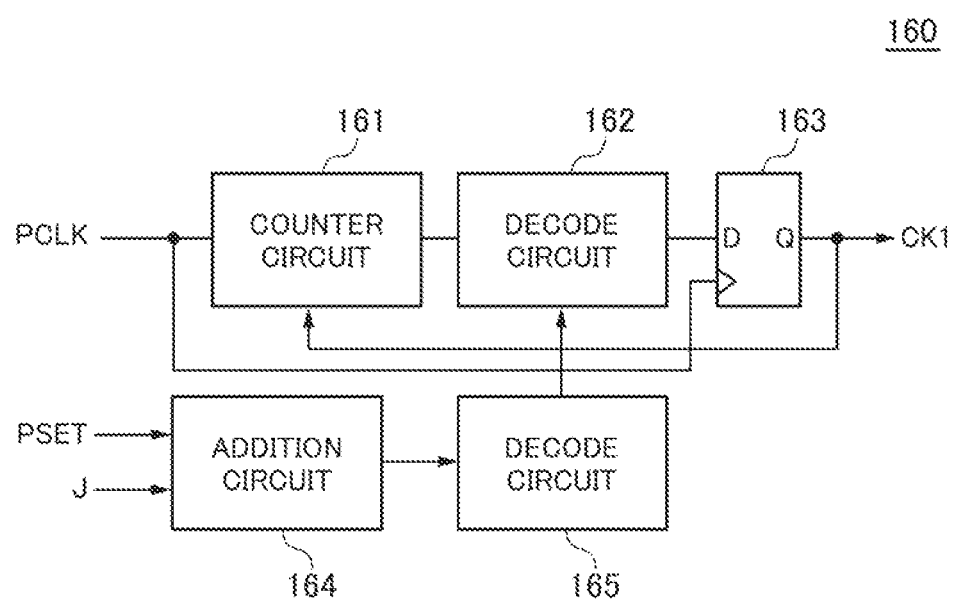
FIG. 6 is a block diagram indicative of an embodiment of a configuration of the update control circuit shown in FIG. 2.

Turning to FIG. 6, the update control circuit 160 includes a counter circuit 161, and a decode circuit 162 that decodes a count value of the counter circuit 161, and that activates an output signal when the decoded value corresponds with a decoded value of a decode circuit 165. An output signal of the decode circuit 162 is supplied to a latch circuit 163 that performs a latch operation in synchronization with the internal clock signal PCLK. An output of the latch circuit 163 is used as the update signal CK1.

In the update control circuit 160, an addition circuit 164 that adds a preset signal PSET and the count value J together is provided. The obtained added value is supplied to the decode circuit 165. The preset signal PSET is a value of tDC+tLM, and is already known at the stage of designing. Therefore, a fixed value decided at the stage of designing can be used as the preset signal PSET. Meanwhile, because the count value J represents tDO/tCK, the added value output from the addition circuit 164 represents the optimum value Nopt of the frequency division ratio N.

The added value output from the addition circuit 164 is then decoded by the decode circuit 165 and supplied to the decode circuit 162. Therefore, the update control circuit 160 can generate the update signal CK1 by dividing the frequency of the internal clock signal PCLK by the optimum value Nopt of the frequency division ratio.

Figure 7:
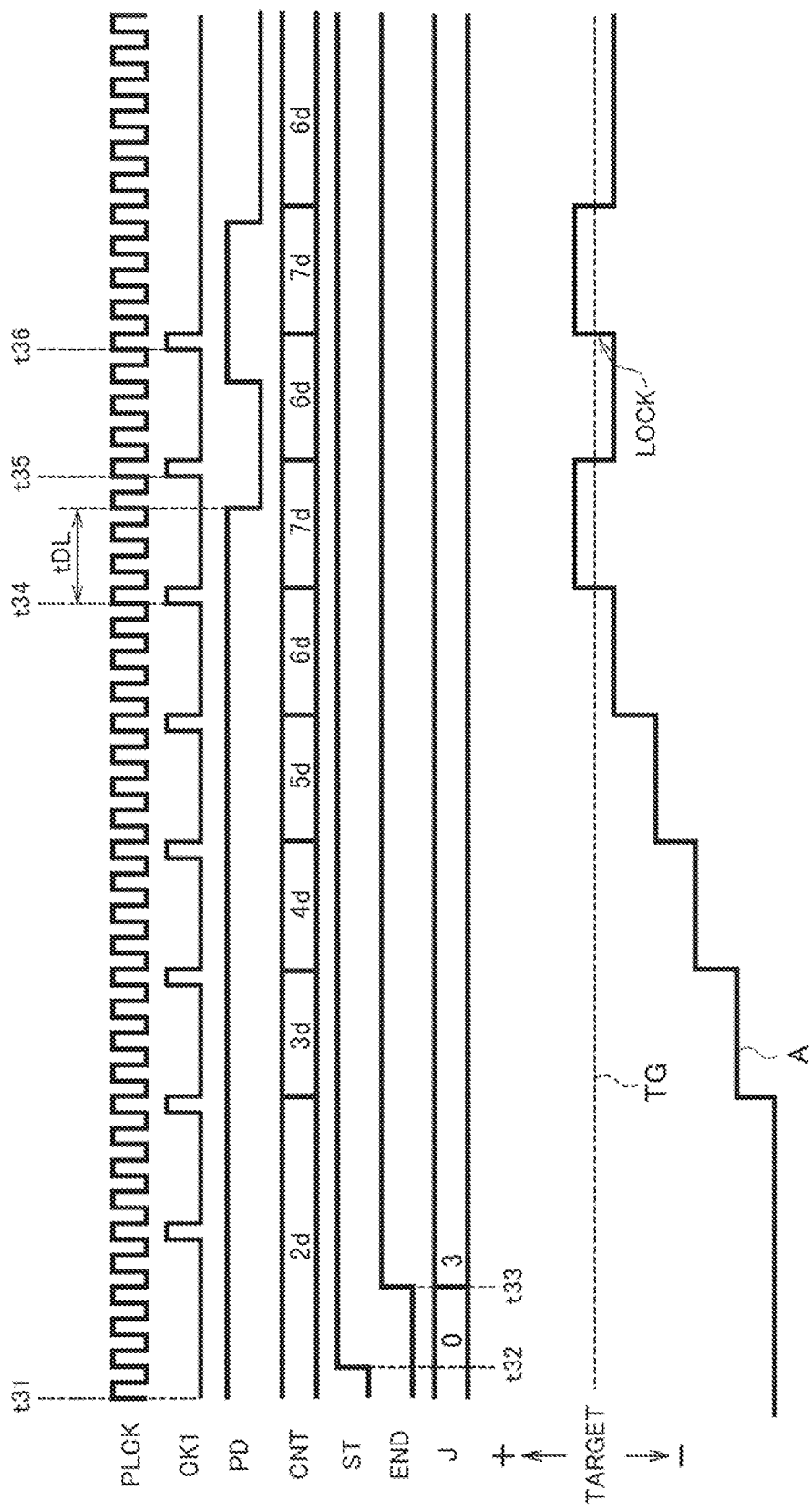
FIG. 7 is a timing diagram for explaining an operation of the DLL circuit shown in FIG. 1.

Turning to FIG. 7, first, when the DLL circuit 100 is reset at a time t31, the enable signal EN shown in FIG. 5 is changed to a high level. Therefore, the internal signal S2 is changed to a high level in synchronization with a rising edge of the internal clock signal PCLK, and also the measurement start signal ST is changed to a high level in synchronization with a falling edge of the internal clock signal PCLK (at a time t32). Further, in the initial state, the internal signal S1 is also at a high level. Therefore, the count-up signal UP output from the NAND gate circuit 175 has an inverted waveform relative to the internal clock signal PCLK. Accordingly, the measurement counter 176 increments the count value J each time a rising edge of the count-up signal UP appears, that is, each time a falling edge of the internal clock signal PCLK appears.

The measurement start signal ST is fed back as the measurement end signal END via the variable delay line 180 and the replica circuit 190. When the measurement end signal END is changed to a high level (at a time t33), the internal signal S1 is changed to a low level, and the count-up signal UP is fixed to a high level. That is, the count value J is determined. In an example shown in FIG. 7, "3" is obtained as the count value J.

The count value J is added to the preset signal PSET by the addition circuit 164 shown in FIG. 6, thereby deciding the added value, that is, the actual value of the frequency division ratio N. In the example shown in FIG. 7, the frequency division ratio N is decided at "4", and thereafter the update signal CK1 is activated every four clock cycles of the internal clock signal PCLK.

In the example shown in FIG. 7, at this point in time, the phase A of the replica clock signal RCLK is advanced, and therefore each time the update signal CK1 is activated, the count value of the up-down counter 140 is counted up and changed from 2 d to 3 d, 4 d, and so on. Accordingly, the phase A of the replica clock signal RCLK gradually approaches the target TG.

The phase A of the replica clock signal RCLK then passes over the target TG by a synchronous control at a time t34, and is changed to the positive side of the target TG. This phase change affects the phase determination signal PD after a lapse of the delay time tDL from the time t34. However, in the first embodiment, the frequency division ratio N is optimally set based on the actual measurement, and therefore the phase determination signal PD is changed before a time t35 at which the update signal CK1 is activated next.

Therefore, at the time t35, the count value of the up-down counter 140 is correctly counted down. Consequently, the phase A of the replica clock signal RCLK passes over the target TG from the positive side to the negative side. At a time t36 at which the update signal CK1 is activated next, the count value of the up-down counter 140 is counted up, and the phase A of the replica clock signal RCLK passes over the target TG from the negative side to the positive side. Thus, the DLL circuit 100 is shifted to the lock state.

As explained above, according to the first embodiment, the actual measurement of tDO/tCK is performed, and based on the actual measurement value, the frequency division ratio N is decided. This can prevent an unnecessary increase in the lock cycle, which is caused when the frequency division ratio N is too high, and can prevent the occurrence of the overshoot phenomenon, which is caused when the frequency division ratio N is too low, and therefore makes it possible to shift the DLL circuit 100 to the lock state earlier.

A second embodiment of the present invention is explained next.

Figure 8:
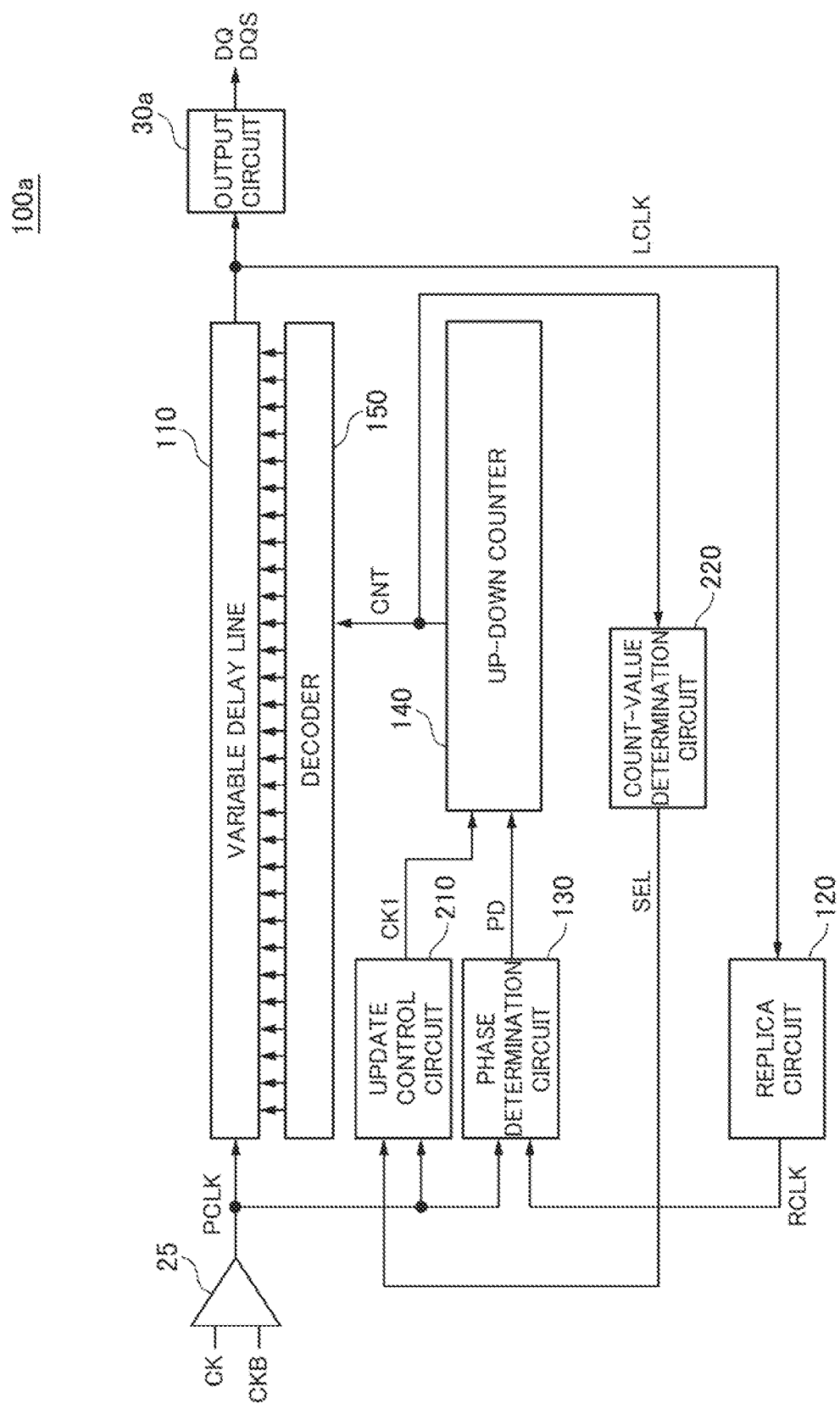
FIG. 8 is a block diagram indicative of an embodiment of a configuration of a DLL circuit according to a second embodiment of the present invention.

Turning to FIG. 8, the DLL circuit 100*a* according to the second embodiment is different from the DLL circuit 100 shown in FIG. 2 in that an update control circuit 210 is used instead of the update control circuit 160, and a count-value determination circuit 220 is added. The measurement circuit 170, the variable delay line 180, and the replica circuit 190 are omitted from the DLL circuit 100*a*. Other features of the DLL circuit 100*a* are identical to those of the DLL circuit 100 shown in FIG. 2, and thus like reference numerals are denoted to like elements and redundant explanations thereof will be omitted.

Instead of the count value J, a selection signal SEL is supplied to the update control circuit 210 from the count-value determination circuit 220. The count-value determination circuit 220 receives the count value CNT of the up-down counter 140, and controls a logic level of the selection signal SEL depending on whether the count value CNT exceeds a predetermined value.

Figure 9:
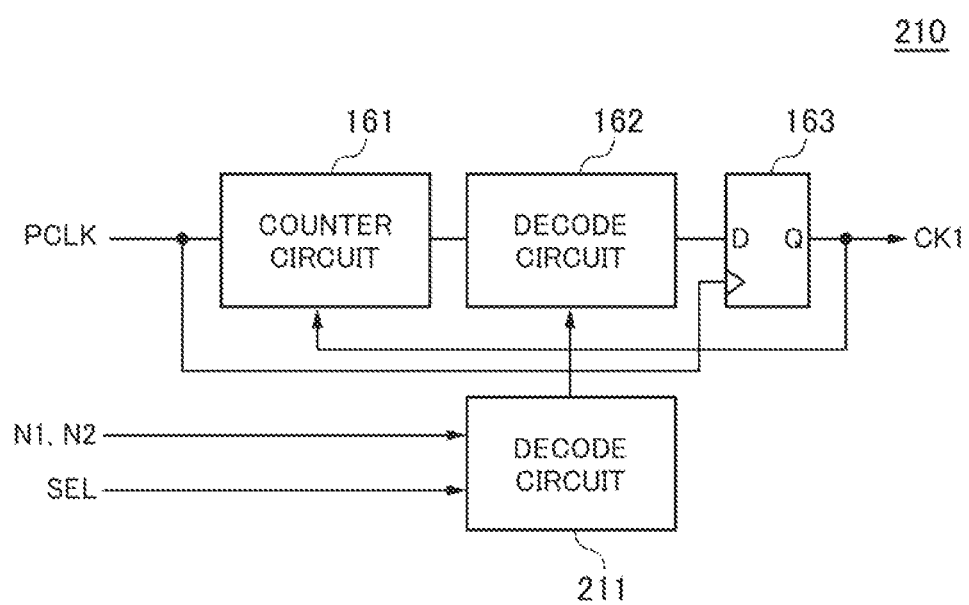
FIG. 9 is a block diagram indicative of an embodiment of a configuration of the update control circuit shown in FIG. 8.

Turning to FIG. 9, the update control circuit 210 is different from the update control circuit 160 shown in FIG. 6 in that a decode circuit 211 is used instead of the addition circuit 164 and the decode circuit 165. Other features of the update control circuit 210 are identical to those of the update control circuit 160 shown in FIG. 6, and thus like reference numerals are denoted to like elements and redundant explanations thereof will be omitted.

The decode circuit 211 receives two different frequency division ratios N1 and N2, and the selection signal SEL, and selects either the frequency division ratio N1 or N2 based on a logic level of the selection signal SEL. A value of a selected frequency division ratio is decoded and then input to the decode circuit 162. The values of the frequency division ratios N1 and N2 are set in advance at the time of designing.

Figure 10:
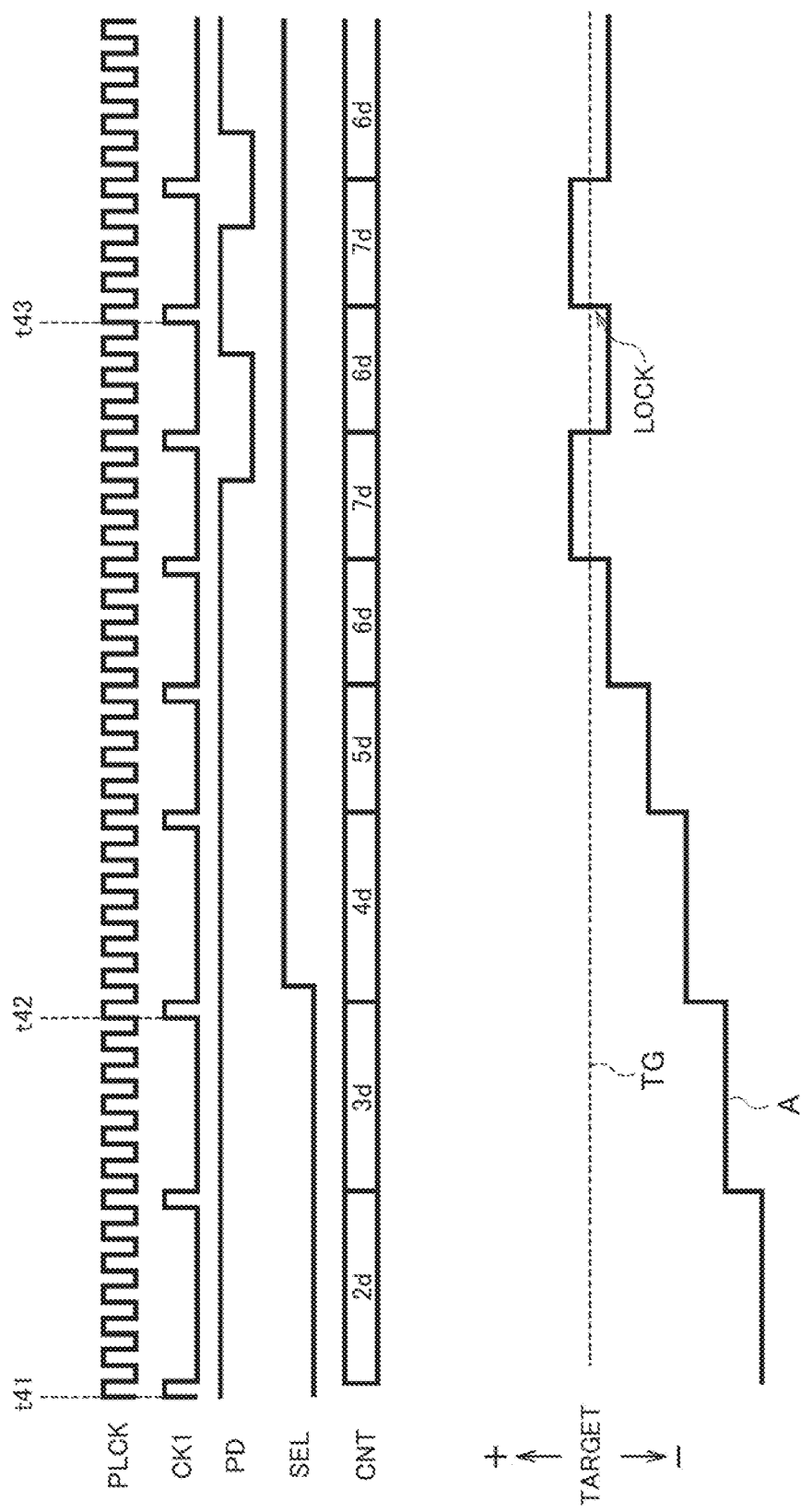
FIG. 10 is a timing diagram for explaining an operation of the DLL circuit shown in FIG. 8.

Turning to FIG. 10, the DLL circuit 100a is designed such that an initial value of the up-down counter 140 is 2 d, and when the count value exceeds 3 d, the selection signal SEL is changed to a high level. First, when the DLL circuit 100a is reset at a time t41, the count value CNT of the up-down counter 140 is set to 2 d that is an initial value. Therefore, the selection signal SEL is at a low level, and the decode circuit 211 selects the frequency division ratio N1. In the example shown in FIG. 10, the value of the frequency division ratio N1 is "6". Accordingly, the update signal CK1 is activated every six clock cycles of the internal clock signal PCLK, and the count value of the up-down counter 140 is counted up or counted down. In the example shown in FIG. 10, because the phase A of the replica clock signal RCLK is advanced, the count value of the up-down counter 140 is counted up in synchronization with the update signal CK1.

Thereafter, when the count value CNT of the up-down counter 140 exceeds 3 d that is a threshold value, the selection signal SEL is changed to a high level by a synchronous control at a time t42. Therefore, the decode circuit 211 selects the frequency division ratio N2. In the example shown in FIG. 10, the value of the frequency division ratio N2 is "4". Accordingly, the update signal CK1 is activated every four clock cycles of the internal clock signal PCLK, and the count value of the up-down counter 140 is counted up or counted down. The DLL circuit 100a is then shifted to the lock state at a time t43.

As described above, in the second embodiment, the frequency division ratio is set to a relatively large value (N1=6) immediately after the DLL circuit 100a is reset, while the frequency division ratio is set to a relatively small value (N2=4) when the count value CNT of the up-down counter 140 exceeds a threshold value. This makes it possible to shift the DLL circuit 100a to the lock state early, even when a large number of the update signals CK1, which are required to shift the DLL circuit 100a to the lock state, are generated.

Further, the second embodiment is more preferable in a case of executing a control to reduce the lock cycle by increasing the adjustment pitch of the variable delay line 110 in the initial stage of a phase adjustment operation. In the example shown in FIG. 10, a relatively large change in the delay amount is made when the count value CNT is changed by one pitch from 2 d or 3 d, while a relatively small change in the delay amount is made when the count value CNT that is equal to or larger than 4 d is changed by one pitch. This makes it possible for the phase A of the replica clock signal RCLK to approach the target TG more quickly. In this case, when the overshoot phenomenon occurs in the initial stage of the phase adjustment operation with a large adjustment pitch, the overshoot amount is so large that an increase in the lock cycle is significant. On the other hand, in the final stage of the phase adjustment operation with a small adjustment pitch, even if the overshoot phenomenon occurs, the overshoot amount is so small that an increase in the lock cycle is minimized. In the second embodiment, because the frequency division ratio is made low in the process of the phase adjustment operation, the increase in the lock cycle, caused by the overshoot, is minimized. This makes it possible to shift the DLL circuit 100a to the lock state at a higher speed.

In contrast to the second embodiment described above, it is possible to set the frequency division ratio N to be relatively low in the initial stage of the phase adjustment operation, and then set the frequency division ratio N to be relatively high when the count value CNT exceeds a threshold value. In this case, because the frequency division ratio of the update signal CK1 becomes high in the final stage of the phase adjustment operation, it is possible to prevent the occurrence of the overshoot phenomenon.

A third embodiment of the present invention is explained next.

Figure 11:
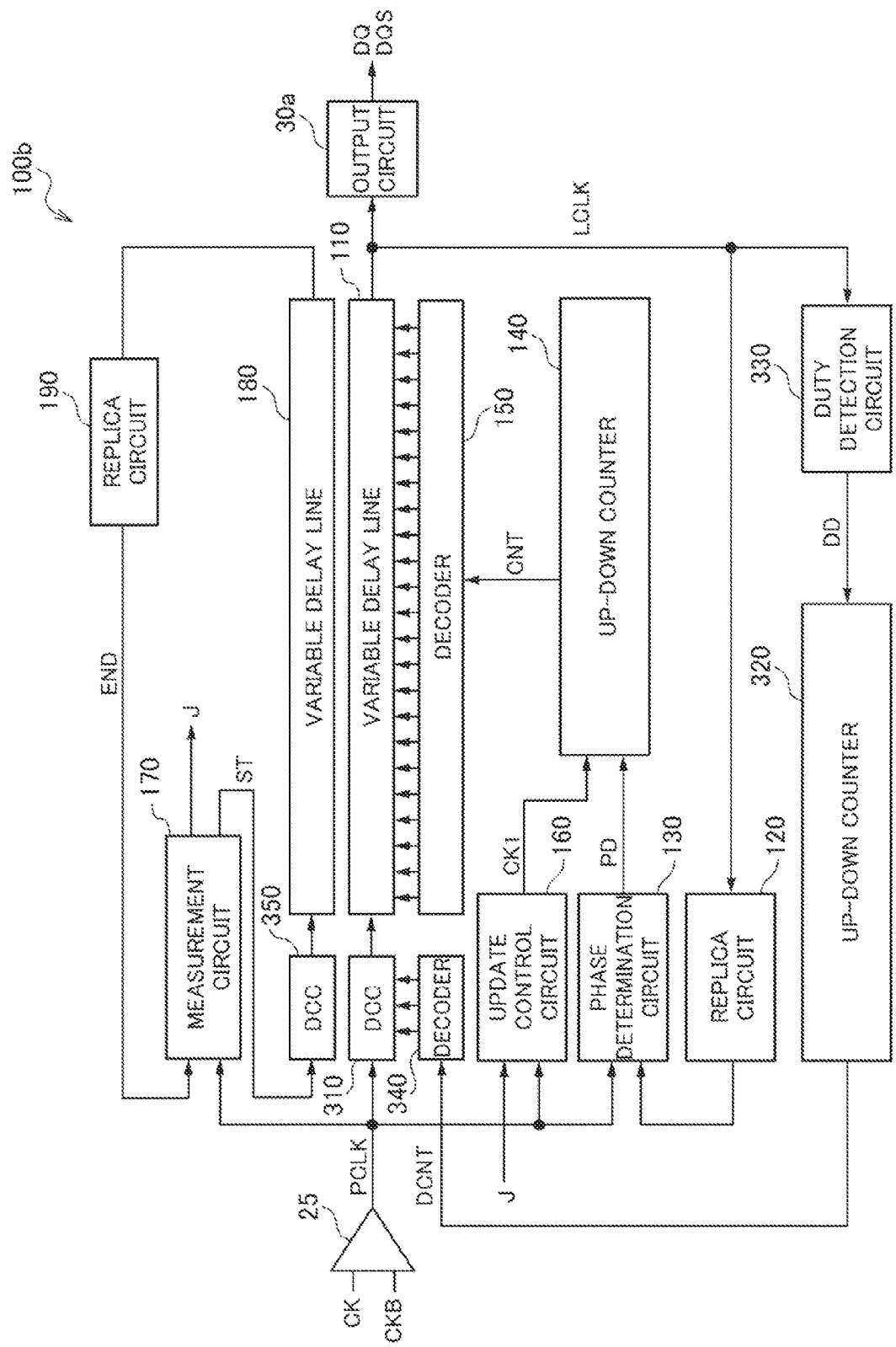
FIG. 11 is a block diagram indicative of an embodiment of a configuration of a DLL circuit 100b according to a third embodiment of the present invention.

Turning to FIG. 11, the DLL circuit 100b according to the third embodiment is different from the DLL circuit 100 shown in FIG. 2 in that a duty correction circuit (DCC) 310 is inserted at the previous stage of the variable delay line 110. The duty correction circuit 310 is a circuit that adjusts the duty ratio of the internal clock signal PCLK. The adjustment of the duty ratio is controlled based on an output of a decoder 340 that decodes a count value DCNT of an up-down counter 320. The count value of the up-down counter 320 is counted up or counted down according to an output signal DD of a duty detection circuit 330 that detects the duty ratio of the internal clock signal LCLK. Therefore, the duty correction circuit 310 adjusts the duty ratio of the internal clock signal PCLK so as to become 50%.

In the DLL circuit 100b configured as described above, a loop delay of a duty-adjusting feedback loop is sometimes greater than that of a phase-adjusting feedback loop. The duty-adjusting feedback loop is a loop that passes through the variable delay line 110, the duty detection circuit 330, the up-down counter 320, the decoder 340, and the duty correction circuit 310. The phase-adjusting feedback loop is a loop that passes through the variable delay line 110, the replica circuit 120, the phase determination circuit 130, and the up-down counter 140. In that case, it suffices that a duty correction circuit 350 that has the same circuit configuration as the duty correction circuit 310 is inserted between the measurement circuit 170 and the variable delay line 180.

According to the third embodiment, actual measurement of tDO/tCK can be performed based on the specific delay tDO on the duty-adjusting side. Therefore, even when a loop delay of the duty-adjusting feedback loop is greater than that of the phase-adjusting feedback loop, it is still possible to obtain the count value J appropriately.

It is apparent that the present invention is not limited to the above embodiments, but may be modified and changed without departing from the scope and spirit of the invention.

For example, in the first to third embodiments, the update signal CK1 is generated by dividing the frequency of the internal clock signal PCLK. However, the method of generating the update signal CK1 is not limited thereto.

Further, in the first and third embodiments, another variable delay line 180 that has the same delay amount as the variable delay line 110 is provided. However, when a configuration is employed in which the variable delay line 110 is used to measure tDO/tCK, it is possible to omit the variable delay line 180. In this case, it suffices that the variable delay line 110 is used in a time-division manner, and after tDO/tCK is measured, generation of the internal clock signal LCLK is started.

Furthermore, in the second embodiment, the frequency division ratio N is switched in response to the count value CNT of the up-down counter 140 exceeding a predetermined threshold value. However, it is also possible to use other information as a trigger for switching the frequency division ratio N, such, as the number of clocks of the internal clock signal PCLK after the DLL circuit 100*a* is reset.

In the third embodiment, the duty correction circuit 310 is connected at the previous stage of the variable delay line 110. However, the connection position of the duty correction circuit 310 is not limited thereto, and the duty correction, circuit 310 can be connected at the subsequent stage of the variable delay line 110, for example.

What is claimed is:

1. A semiconductor device comprising:
    a first delay circuit delaying a first clock signal according to a count value to generate a second clock signal;
    a phase determination circuit comparing a phase of the first clock signal with a phase of the second clock signal to generate a phase determination signal;
    an up-down counter updating the count value according to the phase determination signal each time an update signal is activated; and
    an update control circuit generating the update signal at a variable interval.

2. The semiconductor device as claimed in claim 1, wherein the update control circuit generates the update signal by dividing a frequency of the first clock signal, and generates the update signal at a variable interval by changing a frequency division ratio of the first clock signal.

3. The semiconductor device as claimed in claim 1, wherein the first delay circuit includes a variable delay line that delays the first clock signal according to the count value to generate a third clock signal, and a replica circuit that generates the second clock signal based on the third clock signal.

4. The semiconductor device as claimed in claim 3, further comprising:
    an external terminal; and
    an output circuit driving the external terminal in synchronization with the third clock signal,
    wherein the replica circuit has substantially the same impedance as the output circuit.

5. The semiconductor device as claimed in claim 3, wherein the first delay circuit further includes a first duty correction circuit that adjusts a duty ratio of any one of the first to third clock signals.

6. The semiconductor device as claimed in claim 5, further comprising a duty detection circuit detecting the duty ratio of the third clock signal,
    wherein the first duty correction circuit adjusts the duty ratio of the first clock signal based on an output signal of the duty detection circuit.

7. The semiconductor device as claimed in claim 5, wherein the update control circuit changes a generation interval of the update signal based on a delay amount of the first delay circuit and the first duty correction circuit.

8. The semiconductor device as claimed in claim 7, further comprising a second delay circuit having substantially the same delay amount as the first delay circuit, and a second duty correction circuit having substantially the same delay amount as the first duty correction circuit, wherein
    the second delay circuit and the second duty correction circuit are connected in series, and
    the update control circuit changes the generation interval of the update signal based on a period from when a measurement signal synchronous with the first clock signal is input to one of the second delay circuit and the second duty correction circuit to when the measurement signal is output from the other of the second delay circuit and the second duty correction circuit.

9. The semiconductor device as claimed in claim 1, wherein the update control circuit changes a generation interval of the update signal based on at least a delay amount of the first delay circuit and a clock frequency of the first clock signal.

10. The semiconductor device as claimed in claim 9, further comprising a measurement counter measuring the number of clock cycles from when a first edge of the first clock signal is input to the first delay circuit to when a second edge of the second clock signal corresponding to the first edge appears,
    wherein the update control circuit changes the generation interval of the update signal according to a count value of the measurement counter.

11. The semiconductor device as claimed in claim 10, wherein the update control circuit sets the generation interval of the update signal to be longer as the count value of the measurement counter becomes larger.

12. The semiconductor device as claimed in claim 11, further comprising a second delay circuit having substantially the same delay amount as the first delay circuit, wherein
    the measurement counter counts an edge of the first clock signal during a period from when a measurement signal synchronous with the first clock signal is input to the second delay circuit to when the measurement signal is output from the second delay circuit, thereby generating the count value.

13. The semiconductor device as claimed in claim 10, wherein the update control circuit includes an addition circuit that adds the count value of the measurement counter to a predetermined preset value to generate an added value, and changes the generation interval of the update signal according to the added value.

14. The semiconductor device as claimed in claim 1, wherein the update control circuit changes a generation interval of the update signal according to the count value of the up-down counter.

15. The semiconductor device as claimed in claim 14, wherein the update control circuit shortens the generation interval of the update signal in response to the count value of the up-down counter exceeding a predetermined value.

16. The semiconductor device as claimed in claim 14, wherein the update control circuit generates the update signal at a first interval when an update pitch of the count value of the up-down counter is a first pitch, and generates the update signal at a second interval that is shorter than the first interval when the update pitch is a second pitch that is smaller than the first pitch.

17. A semiconductor device comprising:
    a delay circuit that delaying a first clock signal according to a count value to generate a second clock signal;
    a phase determination circuit comparing a phase of the first clock signal with a phase of the second clock signal to generate a phase determination signal;
    an up-down counter updating the count value according to the phase determination signal each time an update signal is activated; and
    an update control circuit generating the update signal at a first interval, and then generating the update signal at a second interval that is different from the first interval.

18. The semiconductor device as claimed in claim 17, wherein the second interval is shorter than the first interval.

19. The semiconductor device as claimed in claim 17, wherein the update control circuit changes a generation interval of the update signal from the first interval to the second interval based on the count value of the up-down counter.

20. The semiconductor device as claimed in claim 19, wherein the update control circuit changes the generation interval of the update signal from the first interval to the second interval in response to the count value of the up-down counter exceeding a predetermined value.

* * * * *